US010481489B2

(12) United States Patent
Liang et al.

(10) Patent No.: US 10,481,489 B2
(45) Date of Patent: Nov. 19, 2019

(54) MASK PLATE, METHOD FOR MANUFACTURING MASK PLATE, METHOD FOR USING MASK PLATE, AND DEVICE INCLUDING MASK PLATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Kui Liang, Beijing (CN); Yakun Li, Beijing (CN); Xiaopeng Cui, Beijing (CN); Huabin Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/537,949

(22) PCT Filed: Aug. 11, 2016

(86) PCT No.: PCT/CN2016/094636
§ 371 (c)(1),
(2) Date: Jun. 20, 2017

(87) PCT Pub. No.: WO2017/166571
PCT Pub. Date: Oct. 5, 2017

(65) Prior Publication Data
US 2019/0018315 A1    Jan. 17, 2019

(30) Foreign Application Priority Data

Apr. 1, 2016    (CN) .......................... 2016 1 0198665

(51) Int. Cl.
*G03F 1/68*    (2012.01)
*G02F 1/15*    (2019.01)
(Continued)

(52) U.S. Cl.
CPC .............. *G03F 1/68* (2013.01); *G02F 1/1362* (2013.01); *G02F 1/15* (2013.01); *G02F 1/155* (2013.01);
(Continued)

(58) Field of Classification Search
CPC . G03F 1/68; G03F 1/50; G03F 7/2057; G03F 7/70308; G02F 1/15; G02F 1/1514;
(Continued)

(56) References Cited

U.S. PATENT DOCUMENTS

2007/0103612 A1*    5/2007    Lumpkin ............ G03F 7/70291
                                                    349/42
2008/0245975 A1*    10/2008   Miller ................... G03B 27/52
                                                    250/492.22
2011/0299148 A1     12/2011   Miller

FOREIGN PATENT DOCUMENTS

CN    103091906 A    5/2013
CN    103235451 A    8/2013
(Continued)

OTHER PUBLICATIONS

International Search Report and Written Opinion for Application No. PCT/CN2016/094636, dated Jan. 5, 2017, 13 Pages.
(Continued)

*Primary Examiner* — John A McPherson
(74) *Attorney, Agent, or Firm* — Brooks Kushman P.C.

(57) ABSTRACT

A mask plate is provided. The mask plate includes a first transparent substrate. A first transparent electrode, an electrochromic layer and a second transparent electrode are arranged sequentially on the first transparent substrate. The first transparent electrode is configured to be selectively powered so as to form energized regions with different
(Continued)

shapes. A method for manufacturing the mask plate, a device including the mask plate, and a method for using the mask plate are further provided.

14 Claims, 5 Drawing Sheets

(51) Int. Cl.
  *G02F 1/1523* (2019.01)
  *G02F 1/155* (2006.01)
  *G02F 1/161* (2006.01)
  *G03F 7/00* (2006.01)
  *H01L 27/12* (2006.01)
  *G02F 1/1362* (2006.01)

(52) U.S. Cl.
  CPC ............ *G02F 1/1525* (2013.01); *G02F 1/161* (2013.01); *G03F 7/0007* (2013.01); *H01L 27/124* (2013.01); *H01L 27/1288* (2013.01); *G02F 2001/13625* (2013.01)

(58) Field of Classification Search
  CPC .... G02F 1/1516; G02F 1/1523; G02F 1/1524; G02F 1/155; G02F 1/161; G02F 1/1303; G02F 2001/1517
  USPC .......................................................... 430/5
  See application file for complete search history.

(56) References Cited

FOREIGN PATENT DOCUMENTS

| | | |
|---|---|---|
| CN | 203337997 U | 12/2013 |
| CN | 105607377 A | 5/2016 |
| KR | 2013-0006743 A * | 1/2013 |

OTHER PUBLICATIONS

First Office Action for Chinese Application No. 201610198665.7, dated May 14, 2018, 6 Pages.

* cited by examiner

MASK PLATE, METHOD FOR MANUFACTURING MASK PLATE, METHOD FOR USING MASK PLATE, AND DEVICE INCLUDING MASK PLATE

CROSS-REFERENCE TO RELATED APPLICATION

This application is the U.S. national phase of PCT Application No. PCT/CN2016/094636 filed on Aug. 11, 2016, which claims priority to Chinese Patent Application No. 201610198665.7 filed on Apr. 1, 2016, the disclosures of which are incorporated in their entirety by reference herein.

TECHNICAL FIELD

The present disclosure relates to the manufacture of a display device, in particular to a mask plate, a method for manufacturing the mask plate, a method for using the mask plate, and a device including the mask plate.

BACKGROUND

During the manufacture of a thin film transistor liquid crystal display (TFT-LCD), a ultraviolet (UV) mask (also called as a mask plate) is mainly used to shield, in a protective manner, an area where liquid crystals are located in the course of photocuring a sealant and removing an alignment film at a periphery of an active area. This is because, the liquid crystal, as an organic compound, may be pyrolyzed due to the irradiation of strong UV rays. After a short time period of irradiation, an electrical resistivity of the liquid crystal may decrease, and after a long time period of irradiation, the liquid crystal may turn yellow, so a display effect may be adversely affected.

In the related art, usually the UV mask with a certain size is manufactured in accordance with a size of a display panel. FIG. 1 shows a conventional UV mask, where the UV mask includes a black light-shielding area and a grid-like light-transmitting area. However, during the manufacture of display screens, with respect to the display panels with different sizes, it is necessary to manually replace the UV masks with different sizes, resulting in a waste of time. In addition, during the replacement, the UV mask may easily be broken. The UV mask is fixed through suction attachment, so the light-shielding layer may be damaged and the UV mask is disposable. Hence, it is necessary to store a large number of UV masks with different types, and thereby to provide a specific storage space for storing these UV masks in the industrial production, resulting in an enlarged space for the manufacture. Further, each UV mask is every expensive, so the manufacture cost of the display panel may increase.

Hence, there is an urgent need to provide an improved mask plate so as to overcome the above-mentioned drawbacks.

SUMMARY

In one aspect, the present disclosure provides in some embodiments a mask plate, including a first transparent substrate, and a first transparent electrode, an electrochromic layer and a second transparent electrode sequentially arranged on the first transparent substrate. The first transparent electrode is configured to be selectively powered so as to form energized regions with different shapes. Through the mask plate, it is able to control voltages applied to the first transparent electrode and the second transparent electrode, so as to form corresponding light-shielding patterns. In this way, it is able to provide a recyclable and versatile mask plate.

In a possible embodiment of the present disclosure, the mask plate further includes a TFT array arranged between the first transparent substrate and the first transparent electrode and configured to selectively supply power to the first transparent electrode. Through the creative combination of the TFT array and an electrochromic material, it is able to selectively supply power to the electrode.

In a possible embodiment of the present disclosure, the first transparent electrode includes electrode lines crossing each other to form a grid. Through the first transparent electrode including the electrode lines, it is able to provide the energized regions in any shapes, thereby to control the light-shielding pattern.

In a possible embodiment of the present disclosure, the first transparent electrode includes an array formed by a plurality of electrode blocks. In this way, it is able to provide the energized regions in any shapes through the first transparent electrode.

In a possible embodiment of the present disclosure, the electrochromic layer includes an electrochromic material layer, an ion conductive layer and an ion storage layer, and a sealant is arranged at a periphery of each of the electrochromic material layer, the ion conductive layer and the ion storage layer. Through the sealant, it is able to protect the layers in a better manner, thereby to prolong a service life of the mask plate.

In a possible embodiment of the present disclosure, a protection layer is arranged on the second transparent electrode, so as to protect the second transparent electrode.

In a possible embodiment of the present disclosure, the second transparent electrode is arranged on a second transparent substrate, and the second transparent substrate is arranged opposite to the first transparent substrate to form a cell so that the second transparent electrode is formed between the ion storage layer and the second transparent substrate. Through the second transparent substrate, it is able to protect the mask plate in a better manner.

In a possible embodiment of the present disclosure, the second transparent electrode is a whole conductive film layer directly plated onto the ion storage layer. In this way, it is able to reduce the manufacture cost while achieving the technical effect of the present disclosure.

In a possible embodiment of the present disclosure, the second transparent electrode is of a grid-like structure consisting of electrode lines crossing each other or includes an array of electrode blocks.

In a possible embodiment of the present disclosure, another TFT array is formed between the second transparent electrode and the second transparent substrate, so as to control the voltage applied to the second transparent electrode in a better manner.

In a possible embodiment of the present disclosure, an insulation layer is formed at an intersection between each longitudinal electrode line and the corresponding horizontal electrode line crossing the longitudinal electrode line.

In a possible embodiment of the present disclosure, each electrode line of the longitudinal electrode lines and the horizontal electrode lines is electrically connected to a drain electrode of a TFT unit of the TFT array adjacent to the electrode line. In this way, in the case that the electrode line is electrically connected to the adjacent TFT unit, it is able for the electrode line to be powered by the corresponding TFT unit.

In another aspect, the present disclosure provides in some embodiments a method for manufacturing a mask plate, including steps of: providing a first transparent electrode on a first transparent substrate, the first transparent electrode being configured to be selectively powered so as to form energized regions with different shapes; forming an electrochromic layer on the first transparent electrode; and providing a second transparent electrode on the electrochromic layer.

In a possible embodiment of the present disclosure, the step of forming the electrochromic layer includes forming an electrochromic material layer, an ion conductive layer and an ion storage layer sequentially, and the method further includes providing a sealant at a periphery of each of the electrochromic material layer, the ion conductive layer and the ion storage layer. The electrochromic layer is also capable of being formed by an electrochromic element in any other form.

In a possible embodiment of the present disclosure, the method further includes, prior to the step of providing the first transparent electrode, providing a TFT array for selectively supplying power to the first transparent electrode on the first transparent substrate. In this way, it is able to accurately select the energized region by controlling the TFT array.

In a possible embodiment of the present disclosure, the step of providing the first transparent electrode includes providing a grid of electrode lines crossing each other on the TFT array, and each electrode line is connected to a drain electrode of a TFT unit of the TFT array adjacent to the electrode line.

In a possible embodiment of the present disclosure, the step of providing the first transparent electrode further includes providing an insulation layer at an intersection between every two electrode lines crossing each other.

In a possible embodiment of the present disclosure, the step of providing the first transparent electrode includes providing an array of electrode blocks on the TFT array, and each electrode block is connected to a drain electrode of a TFT unit of the TFT array adjacent to the electrode block.

In a possible embodiment of the present disclosure, the step of providing the second transparent electrode on the ion storage layer includes forming the second transparent electrode on a second transparent substrate, and arranging the second transparent substrate opposite to the first transparent substrate to form a cell.

In a possible embodiment of the present disclosure, the step of providing the second transparent electrode on the ion storage layer includes plating a conductive film layer onto the ion storage layer through an electroplating process.

In yet another aspect, the present disclosure provides in some embodiments a method for using the above-mentioned mask plate for the manufacture of a display panel, including a step of, with respect to a plurality of display panels with different sizes, pre-storing a plurality of schemes for the mask plate, each scheme being provided so as to enable the mask plate to be provided with a light-shielding pattern corresponding to the corresponding display panel.

In still yet another aspect, the present disclosure provides in some embodiments a UV-curing device, including the above-mentioned mask plate.

According to the embodiments of the present disclosure, by combining an electrochromic principle of photochromic glass and the specific electrode arrangement, it is able to provide the versatile mask plate where different electric signals are capable of being selectively applied to the specific regions.

In addition, the mask plate may be built in the UV-curing device, and specific parameters may be set with respect to the display panels with different sizes. For these display panels, it is able to acquire the desired light-shielding pattern by merely changing the parameter without any necessary to replace the mask plate, thereby to save time.

Further, through the use of the mask plate in the UV-curing device, it is unnecessary to customize the mask plate, and thereby the manufacture cost may be reduced. In the case of manufacturing the display panel, it is also unnecessary to provide a storage space for storing the mask plates, thereby to reduce the space. Moreover, it is able to reduce the time for replacing the mask plate, thereby to decrease idle time of the production line.

BRIEF DESCRIPTION OF THE DRAWINGS

The following drawings, as a part of the specification, are provided so as to facilitate the understanding of the embodiments. These drawings together with the descriptions thereof are used to illustrate the principle of the present disclosure. Through the following details, any other embodiments and expected advantages thereof may become more apparent. Shapes and sizes of the members in the drawings are for illustrative purposes only, but shall not be used to reflect any actual scale. In the drawings, an identical reference sign represents an identical or similar member.

DETAILED DESCRIPTION OF THE EMBODIMENTS

The present disclosure will be described hereinafter in conjunction with the drawings and the embodiments. Such terms as "top", "bottom", "left", "right", "on" and "under" are used with reference to the drawings, but shall not be construed as limiting specific directions. It should be appreciated that, any alternations may be made without departing from the scope of the present disclosure, i.e., the scope of the present disclosure shall be defined by the appended claims rather than being defined by the following embodiments.

It should be further appreciated that, unless otherwise specified, the features in the embodiments of the present disclosure may be combined with each other.

Figure 1:
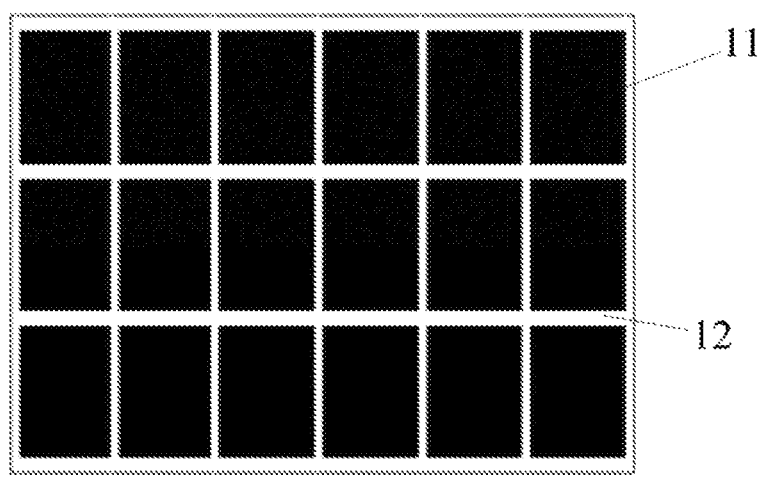
FIG. 1 is a schematic view showing a conventional UV mask.

As shown in FIG. 1, which is a schematic view showing a conventional UV mask, the UV mask includes light-shielding regions 11 and light-transmitting regions 12 each arranged at a fixed position. In use, each light-shielding region 11 corresponds to an active area (AA) of a liquid crystal panel, so as to shield, in a protective manner, liquid crystals in each AA during the UV curing operation. Each light-transmitting region 12 corresponds to a region in the liquid crystal panel where a sealant and a periphery of an active display region are located, so as to allow UV rays to be transmitted through the UV mask to a corresponding region during the UV curing operation, thereby to photo-cure the sealant and remove an alignment film at the periphery of the AA. However, in the conventional UV mask, due to the fixed positions of the light-shielding regions 11 and the light-transmitting regions 12, it is necessary to provide different UV masks for the liquid crystal panels with different sizes, resulting in a complex manufacture process and a high manufacture cost.

Figure 2:
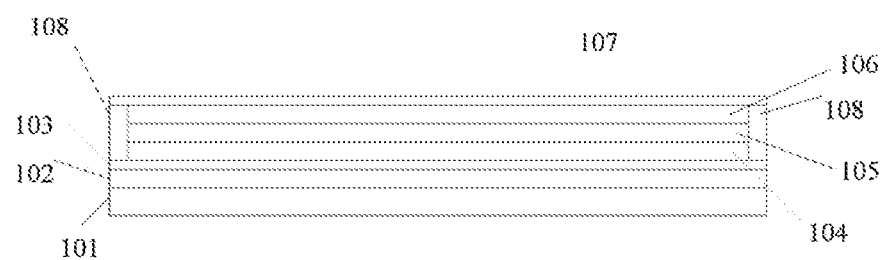
FIG. 2 is a sectional view of a mask plate according to at least one embodiment of the present disclosure.

As shown in FIG. 2 which is a sectional view of a mask plate according to one embodiment of the present disclosure, the mask plate mainly includes, from bottom to top, a transparent substrate 101, a TFT array 102, a first transparent electrode 103, an electrochromic material layer 104, an ion conductive layer 105, an ion storage layer 106, and a second transparent electrode 107. The transparent substrate 101 may be made of such a material as glass or transparent resin. The TFT array 102 and the transparent substrate 101 form a structure similar to an array substrate of a liquid crystal panel. The TFT array 102 may be formed using a method similar to the formation of the TFT array in a conventional array substrate. For example, a gate electrode, a gate insulation layer, an active layer and a source-drain layer may be formed on a substrate, so as to acquire the conventional TFT array with a top-gate or bottom-gate structure. The first transparent electrode 103 is arranged on the TFT array 102, so as to be powered by each TFT unit in the TFT array 102. Of course, for the mask plate in the embodiments of the present disclosure, the first transparent electrode is not limited to be powered by the TFT array, and instead, it may be powered in any other ways. For example, a plurality of power lines may be connected to the first transparent electrode, and a switch array may be arranged on the mask plate so as to control the power supplied to the first transparent electrode. The following description will be given on the basis of the powering method for the TFT array.

Figure 3:
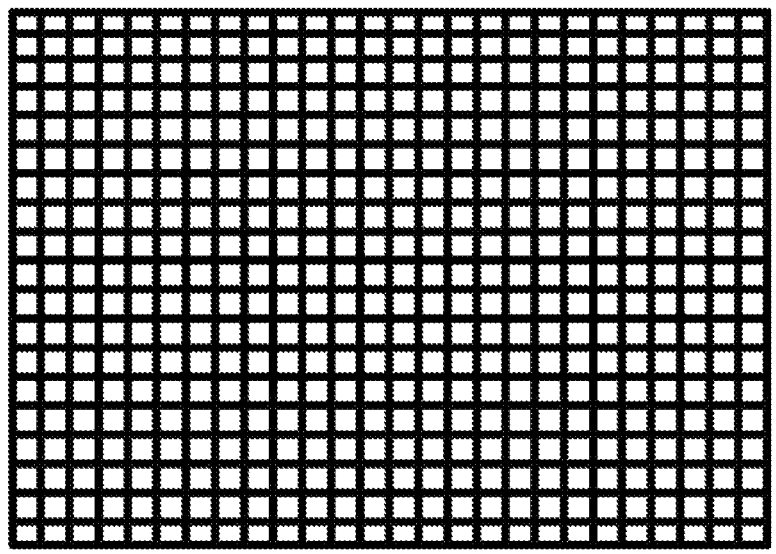
FIG. 3 is a planar view of an electrode according to at least one embodiment of the present disclosure.

In a possible embodiment of the present disclosure, the first transparent electrode 103 is of a grid-like structure consisting of electrode lines crossing each other (as shown in FIG. 3). As those mentioned hereinafter, the electrode lines crossing each other include horizontal thin film electrodes and longitudinal thin film electrodes arranged uniformly. Each of the horizontal thin film electrodes and longitudinal thin film electrodes may be formed through plating and etching. Each horizontal thin film electrode is insulated from the corresponding longitudinal thin film electrode. For example, an insulation layer may be arranged at an intersection between the horizontal thin film electrode and the corresponding longitudinal thin film electrode. Through the electrode lines crossing each other, it is able to form the grid over an entire operating region of the mask plate. A width of each electrode line and a distance between the adjacent electrode lines may be set in accordance with a size of a desired pattern.

Referring again to FIG. 2, the electrochromic material layer 104, the ion conductive layer 105 and the ion storage layer 106 together form an electrochromic layer. The electrochromic material layer 104 mainly functions as to change its color, and it may be made of such a material as an alloy of a transition element or rare earth element and magnesium (e.g., an magnesium-nickel alloy), or nickel oxide. The ion conductive layer 105, also called as an electrolyte layer, may be made of an electrolyte in a solid or liquid state, and it may function as to enable ions (e.g., such small, positive ions as H+ or Li+) to be transported between the electrochromic material layer 104 and the ion storage layer 106. The ion storage layer 106, also called as a counter electrode layer, may function as to store therein and provide the ions for the electrochromic process, so as to maintain balance in the electrochromic process. In order to maintain stable structures of the electrochromic material layer 104, the ion conductive layer 105 and the ion storage layer 106, a sealant 108 may be arranged at a periphery of each of these layers. In a possible embodiment of the present disclosure, the sealant 108 may be arranged between the upper and lower transparent electrodes. It should be appreciated that, the electrochromic layer may also be implemented by any other elements capable of achieving the electrochromic process.

The second transparent electrode 107 may be a complete electrode film layer (i.e., the electrode film layer has no holes or vias), and it may be connected to and powered by a power supply electrode which has a polarity opposite to an electrode from which the power is applied to the TFT.

Figure 4:
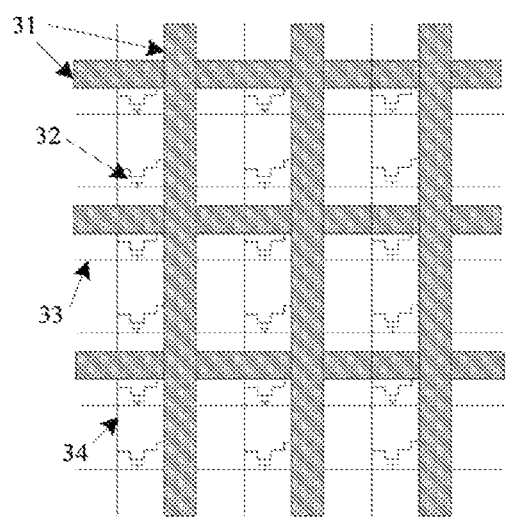
FIG. 4 is a schematic view showing a connection relationship between the electrode in FIG. 3 and a TFT unit.

A connection mode between the TFT array and the electrode will be described hereinafter in details. As shown in FIG. 4, in a possible embodiment of the present disclosure, the electrode lines 31 crossing each other are electrically connected to the drain electrodes of the adjacent TFT units 32. A gate line 33 and a source line 34 of each TFT unit 32 are configured to control on and off states of the TFT unit 32. For example, the electrode line 31 may be directly lapped onto the drain electrode of the TFT unit. In order to ensure that each electrode line is powered in a sufficient manner, the TFT units in one row or one column may be connected to a same horizontal electrode line or a same longitudinal electrode line. Each TFT unit may be connected to merely one electrode line, so as to supply power to the electrode line by turning on the TFT unit connected to the electrode line. Through the power supply to a specific electrode line, it is able to acquire a transparent region with a grid-like structure. To be specific, it is able to acquire the grid-like structure with different sizes by controlling the power supply to the TFT array. For the thin film electrode, a width of each of the longitudinal and horizontal electrode lines and a distance between the adjacent electrode lines may be set in accordance with a size of a desired pattern, e.g., the width or distance may be set as, but not limited to, several micrometers to hundreds of micrometers. In a possible embodiment of the present disclosure, the distance between the adjacent electrode lines may be constant, i.e., the electrode lines may be distributed uniformly on the mask plate.

Figure 5:
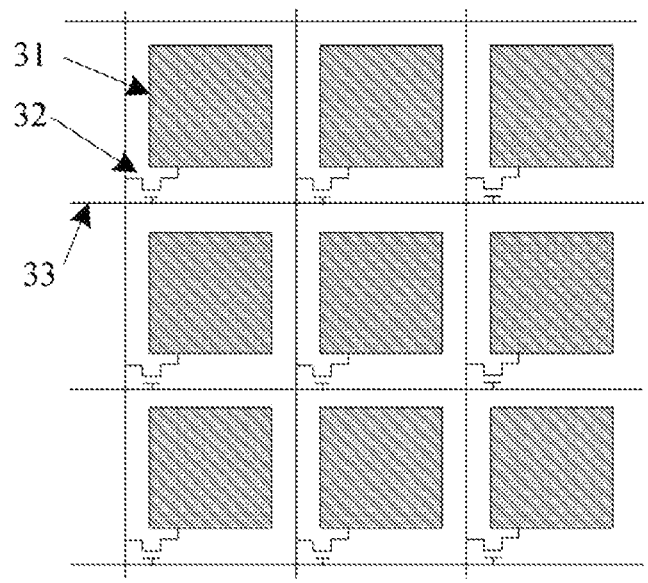
FIG. 5 is another planar view of the electrode according to at least one embodiment of the present disclosure.

FIG. 5 is another planar view of the electrode according to one embodiment of the present disclosure. The electrode may include an array of electrode blocks 31 in FIG. 5. Each electrode block 31 may be electrically connected to the drain electrode of the adjacent TFT unit 32, and the gate line 33 and the source line 34 of the TFT unit 32 may be configured to control the on and off states of the TFT unit 32. For example, the electrode line 31 may be directly lapped onto the drain electrode of the adjacent TFT unit 32. As compared with FIG. 4, in FIG. 5, it is able to acquire a mask pattern of any shapes, including but not limited to a block-like mask pattern, by controlling the TFT units 32 to supply power to the electrode blocks 31 at a corresponding region. It should be appreciated that, each electrode bock 31 is not limited to be of a rectangular shape as shown in FIG. 5, and instead, it may be of various shapes, e.g., a polygonal shape. In addition, a distribution density of the electrode blocks may be set in accordance with the accuracy of the mask pattern.

In a possible embodiment of the present disclosure, the second transparent electrode 107 may also be arranged in a similar manner as shown in FIG. 4 or 5, so as to cooperate with the first transparent electrode 103, thereby to provide the transparent pattern in a more accurate manner. In another possible embodiment of the present disclosure, a protection layer may be further arranged on the second transparent electrode 107, so as to protect the second transparent electrode 107.

Depending on their materials, the layers may be formed through electroplating, deposition or etching, which will not be particularly defined herein.

Figure 6:
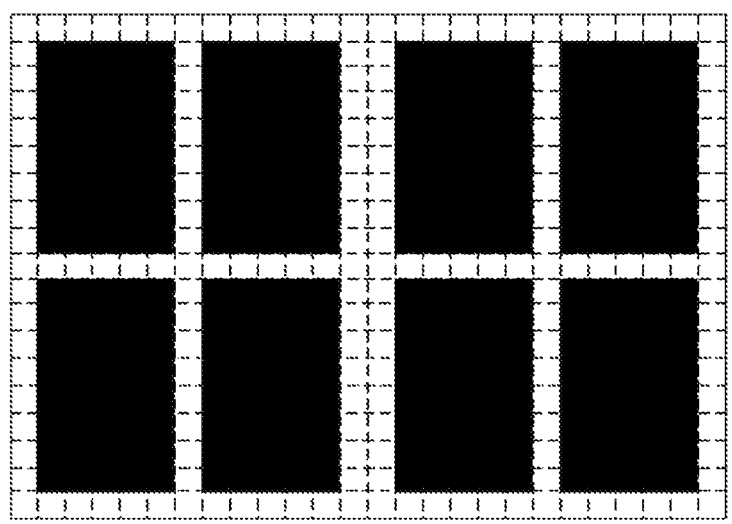
FIG. 6 is a schematic view showing an operating state of the mask plate according to at least one embodiment of the present disclosure.

An operating principle of the electrochromic layer will be described hereinafter. In a state without power supply, the electrochromic layer is in a metallic reflection state and it is nontransparent, e.g., in black as shown by a black block in FIG. 6. In the case that the first transparent electrode includes the electrode lines crossing each other and the second transparent electrode includes a complete electrode layer, after parts of the electrode lines of the first transparent electrode are powered through the TFT units and a corresponding voltage is applied to the second transparent electrode, the electrochromic material layer at a region corresponding to the parts of the electrode lines may absorb H+ or any other ions, and then may be converted into a non-conductive, transparent state, as shown by a region surrounding the black block in FIG. 6. For ease of understanding, at the region surrounding the black block, the dotted lines are used to illustratively show the grid arrangement of the electrode lines. Usually, the electrode line is made of a transparent material, so it is invisible. In the embodiments of the present disclosure, at least one of the electrodes is of a grid-like structure consisting of the electrode lines crossing each other, so in actual application, it is able to apply voltages to the electrodes at both sides of a region where the UV irradiation needs to be performed in accordance with a size and a position of the region, so as to acquire a transparent grid in FIG. 6, thereby to acquire a nontransparent, block-like array.

An electrochromic principle will be described hereinafter by taking a hydride of a rare earth element or transition metal and magnesium as an example. The electrochromic process may be represented by the following equation: $2M+xH_2=2MHx$, where M represents an alloy of the rare earth element or transition element and magnesium, MHx represents a compound of the rare earth element or transition element and hydrogen, and $H_2$ represents hydrogen. As a value of x changes, the film layer may exhibit different properties. For example, in the case that M is yttrium and no hydrogen is supplied, an yttrium film is in a reflection state. During the supply of hydrogen, the yttrium film may absorb hydrogen atoms to form an yttrium hydride, whose light transmittance performance varies along with a ratio of yttrium atoms to hydrogen atoms. In the case that x has a value of 2, the yttrium film may have the strongest metallicity and thus may be in a high-reflection, conductive state. In the case that the value of x increases to 2.85, the ability of the yttrium film to reflect light may be degraded to some extent. In the case that the value of x increases continuously to 3, the yttrium film may be completely transparent. For another example, in the case that M is $Mg_2Ni$, the original metallic film is in a high-reflection, conductive state. In the case that the metallic film absorbs hydrogen atoms, its light transmittance performance may change gradually. In the case that x has a value of 4, the metallic film has absorbed a maximum content of hydrogen atoms, and at this time, the metallic film is in a transparent state. The so-called electrochromic process just refers to controlling the yield of hydrogen in the ion storage layer by changing a current or voltage applied to the electrochromic layer, so as to control the electrochromic layer.

Figure 7:
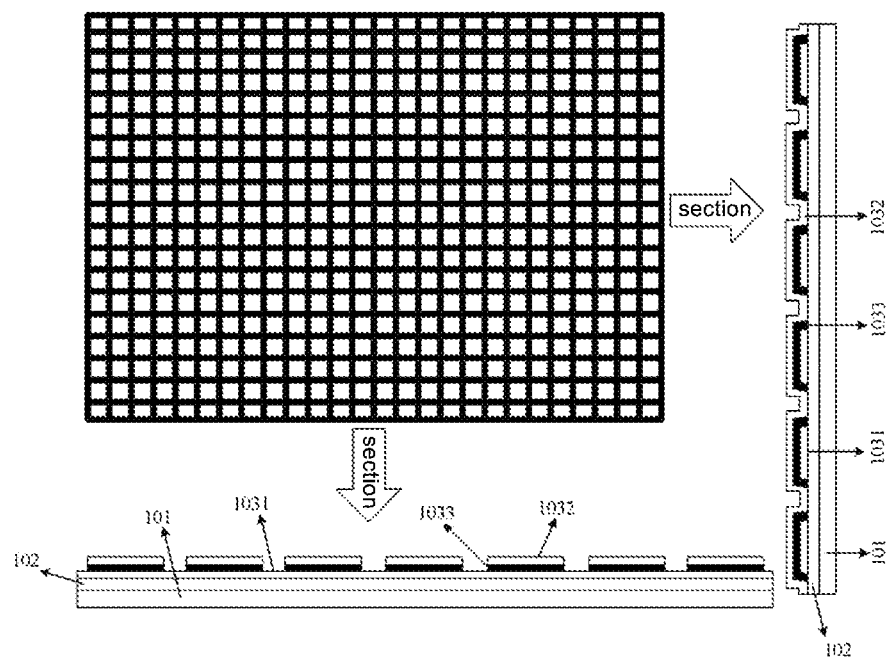
FIG. 7 is a sectional view of an array substrate of the mask plate including electrode lines crossing each other according to at least one embodiment of the present disclosure.

As shown in FIG. 7, which is a sectional view of an array substrate with the horizontal and longitudinal electrode lines in the mask plate, the array substrate includes the transparent substrate 101, the TFT array 102, and the first transparent electrode 103 of a grid-like structure consisting of the electrode lines crossing each other. The transparent substrate 101 on which the TFT array 102 is arranged may be manufactured by a method similar to that for manufacturing an array substrate of a display panel, and thus will not be particularly defined herein. The first transparent electrode 103 of a grid-like structure consisting of the transparent conductive electrode lines crossing each other may be formed on the transparent substrate 101 on which the TFT array 102 is arranged. The first transparent electrode 103 may include horizontal thin film electrodes 1031 and longitudinal thin film electrodes 1032. An insulation layer 1033 may be formed at an intersection between each horizontal thin film electrode 1031 and the corresponding longitudinal thin film electrode 1032. The horizontal thin film electrodes 1031, the insulation layers 1033 and the longitudinal thin film electrodes 1032 may each be formed through a plating and etching process, including physical vapor deposition (PVD) and wet etching or dry etching. As compared with any other process, it is able for the plating and etching process to improve the accuracy and quality in a better manner. Each thin film electrode may be made of indium tin oxide (ITO), aluminium-doped zinc oxide (AZO), antimonium-doped tin oxide (ATO), or fluorine-doped tin oxide (FTO).

Figure 8:
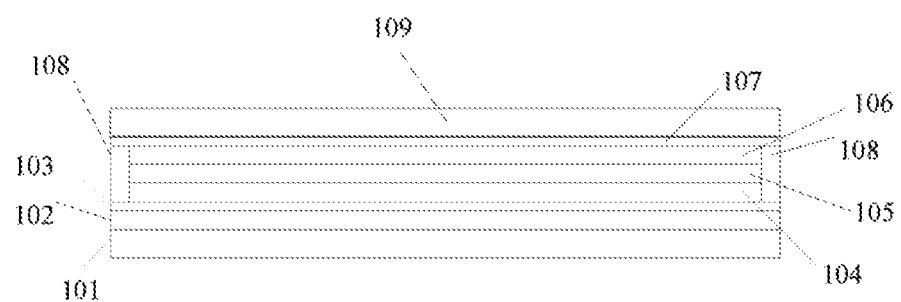
FIG. 8 is another sectional view of the mask plate according to at least one embodiment of the present disclosure.

FIG. 8 is another sectional view of the mask plate according to one embodiment of the present disclosure. As compared with FIG. 2, in FIG. 8, another transparent substrate 109 is arranged on the second transparent electrode 107, with the elements similar to those in FIG. 2 being omitted. Through the transparent substrate 109, it is able to improve the endurance of the entire mask plate. In addition, the second transparent electrode 107 may be formed on the transparent substrate 109 in advance, and then the two transparent substrates may be arranged opposite to each other to acquire the final mask plate, so as to improve the production efficiency and the yield.

Figure 9:
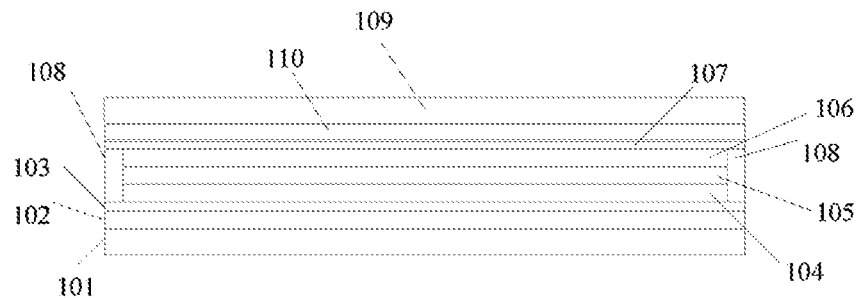
FIG. 9 is yet another sectional view of the mask plate according to at least one embodiment of the present disclosure.

FIG. 9 is yet another sectional view of the mask plate according to one embodiment of the present disclosure. FIG. 9 differs from FIG. 8 in that another TFT array 110 is arranged between the second transparent electrode 107 and the other transparent substrate 109, with the identical members similar to those in FIG. 8 being omitted. The TFT array 110 may be arranged on the other transparent substrate 109 in a way similar to the TFT array 102. In the actual manufacture process, the array substrates which have an identical specification and each include the TFT array and the electrode layer of a grid-like structure consisting of the electrode lines crossing each other may be manufactured in advance and serve as an upper substrate and a lower substrate respectively, so as to simplify the manufacture process. In addition, the first transparent electrode 103 and the second transparent electrode 107 may be each of a grid-like structure consisting of the electrode lines crossing each other, so as to acquire the pattern in a more accurate manner.

Figure 10:
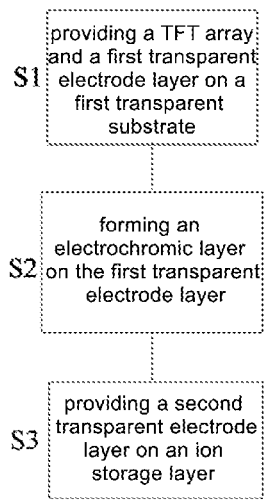
FIG. 10 is a flow chart of a method for manufacturing the mask plate according to at least one embodiment of the present disclosure.

FIG. 10 is a flow chart of a method for manufacturing the mask plate according to one embodiment of the present disclosure. The method mainly includes: Step S1 of providing the TFT array 102 and the first transparent electrode 103 on the first transparent substrate 101; Step S2 of forming the electrochromic layer on the first transparent electrode 103; and Step S3 of providing the second transparent electrode 107 on the ion storage layer 106. The first transparent electrode 103 is configured to be powered by the TFT array 102 so as to form energized regions with different shapes. The electrochromic layer includes the electrochromic material layer 104, the ion conductive layer 105 and the ion storage layer 106 formed sequentially. For example, the first transparent electrode 103 is of a grid-like structure consisting of horizontal thin film electrode lines and longitudinal thin film electrode lines crossing each other, and each electrode line is connected to the drain electrode of the TFT unit of the TFT array adjacent to the electrode line. In a possible embodiment of the present disclosure, the insulation layer is arranged at an intersection between every two electrode lines crossing each other. The second transparent electrode 107 may be a complete electrode layer (e.g., a conductive film layer plated onto the ion storage layer through an electroplating process) or include the electrode lines crossing each other like the first transparent electrode 103. For another example, the first transparent electrode 103 may include an array of electrode blocks, and each electrode block may be connected to the drain electrode of the TFT unit of the TFT array adjacent to the electrode block.

The method may further include providing a sealant at a periphery of each of the electrochromic material layer, the ion conductive layer and the ion storage layer, so as to protect these layers in a better manner.

In a possible embodiment of the present disclosure, a protection layer (not shown in FIG. 2) may be formed on the second transparent electrode, so as to protect the second transparent electrode. In another possible embodiment of the present disclosure, the second transparent electrode may be formed on a second transparent substrate, and then the second transparent substrate and the first transparent substrate may be arranged opposite to each other to form a cell, so as to protect the layers of the mask plate in a better manner.

In a possible embodiment of the present disclosure, prior to the step of forming the second transparent electrode 107 on the second transparent substrate 109, another TFT array 110 may be formed on the second transparent substrate 109, so as to acquire the mask plate as shown in FIG. 7.

In actual use, the mask plate, as a regular member, may be arranged in a UV curing device for manufacturing an LCD. In addition, during the curing operation, the electrode lines of the electrode that need to be powered may be determined in accordance with a size and a dot pitch of a display panel to be processed by the UV curing device, and then an appropriate light-shielding pattern may be acquired in accordance with a determination result, so as to cure the display panel. Advantageously, in actual use, corresponding schemes may be set in advance in accordance with the types of the display panels to be processed. For each scheme, parameters of the corresponding mask pattern may be stored, so as to automatically process the corresponding display panel using the corresponding scheme. In addition, during the processing, different voltages may be applied to the electrode lines in accordance with different requirements on the light transmittance, so as to acquire the light-transmitting regions having different light transmittance, thereby to enhance the application range of the mask plate in the embodiments of the present disclosure.

It should be appreciated that, the mask plate in the embodiments of the present disclosure may not only be used as a light-shielding plate in the UV curing device, but also as a light-shielding plate where a light-shielding pattern needs to be changed.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure, so the scope of the present disclosure shall be subject to the appended claims.

It should be appreciated that, such words as "on", "under", "inside" and "outside" are merely used for simplifying the description, and they merely refer to a direction or a position relationship as shown in the drawings, but shall not be used to indicate or imply that the device or member must be arranged or operated at a specific position. In addition, although mentioning an order of the steps, these steps are not necessarily performed in the order, and instead, these steps may be performed in a contrary or parallel manner, without departing from the spirit of the present disclosure. The word "include" shall not be construed as excluding any element or step not defined in the claims. Such words as "one" or "one of" are merely used to represent the existence of at least one member, rather than to limit the number thereof. Such a simple fact that some measures have been defined in the different dependent claims does not indicate that the combination of these measures cannot be used for improvement. Any reference signs in the claims shall not be construed as limiting the scope of the present disclosure.

What is claimed is:

1. A mask plate, comprising:
   a first transparent substrate;
   first transparent electrode, an electrochromic layer and a second transparent electrode arranged sequentially on the first transparent substrate; and
   thin film transistor (TFT) array arranged between the first transparent substrate and the first transparent electrode and configured to selectively supply power to the first transparent electrode,
   herein the first transparent electrode is configured to be selectively powered to form energized regions with different shapes,
   the first transparent electrode is of a grid-like structure consisting of horizontal electrode lines and longitudinal electrode lines crossing each other.

2. The mask plate according to claim 1, wherein the electrochromic layer comprises an electrochromic material layer, an ion conductive layer and an ion storage layer, and a sealant is provided at a periphery of each of the electrochromic material layer, the ion conductive layer and the ion storage layer.

3. The mask plate according to claim 1, wherein a protection layer is arranged on the second transparent electrode.

4. The mask plate according to claim 1, wherein the second transparent electrode is arranged on a second transparent substrate, and the second transparent substrate and the first transparent substrate are arranged opposite to each other to form a cell, so that the second transparent electrode is arranged between the electrochromic layer and the second transparent substrate.

5. The mask plate according to claim 4, wherein the second transparent electrode is of a grid-like structure consisting of horizontal electrode lines and longitudinal electrode lines crossing each other.

6. The mask plate according to claim 5, wherein another TFT array for supplying power to the second transparent electrode is further arranged between the second transparent electrode and the second transparent substrate.

7. The mask plate according to claim 4, wherein the second transparent electrode comprises an array of electrode blocks.

8. The mask plate according to claim 1, wherein the second transparent electrode is a complete conductive film layer, and the second transparent electrode is directly plated onto the electrochromic layer.

9. The mask plate according to claim 1, wherein an insulation layer is arranged at an intersection between each longitudinal electrode line and a corresponding horizontal electrode line crossing the longitudinal electrode line.

10. The mask plate according to claim 1, wherein each electrode line of the longitudinal electrode lines and the horizontal electrode lines is electrically connected to a drain electrode of a TFT unit of a TFT array adjacent to the electrode line.

11. A method for using the mask plate according to claim 1 in manufacture of a display panel, comprising, with respect to the display panels with different sizes, pre-storing a plurality of schemes for the mask plate in advance, wherein each scheme is provided to enable the mask plate to be provided with a light-shielding pattern corresponding to a corresponding display panel.

12. A method for manufacturing a mask plate, comprising:
providing a first transparent substrate;
providing a thin film transistor (TFT) array on the first transparent substrate;
providing a first transparent electrode on the TFT array;
forming an electrochromic layer on the first transparent electrode; and
providing a second transparent electrode on the electrochromic layer,
wherein the first transparent electrode is selectively powered by the TFT array to form energized regions with different shapes,
the first transparent electrode is of a grid-like structure consisting of horizontal electrode lines and longitudinal electrode lines crossing each other and each electrode line is connected to a drain electrode of a TFT unit of the TFT array adjacent to the electrode line.

13. The method according to claim 12, wherein the forming the electrochromic layer comprises forming an electrochromic material layer, an ion conductive layer and an ion storage layer sequentially, and the method further comprises providing a sealant at a periphery of each of the electrochromic material layer, the ion conductive layer and the ion storage layer.

14. The method according to claim 12, wherein the providing the first transparent electrode further comprises providing an insulation layer at an intersection between every two electrode lines crossing each other.

* * * * *